(12) United States Patent
Pomar et al.

(10) Patent No.: US 6,498,758 B1
(45) Date of Patent: Dec. 24, 2002

(54) TWISTED BITLINES TO REDUCE COUPLING EFFECTS (DUAL PORT MEMORIES)

(75) Inventors: Sudeep A. Pomar, Bloomington, MN (US); Carl A. Monzel, Lakeville, MN (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/047,547

(22) Filed: Jan. 16, 2002

(51) Int. Cl.$^7$ .................................................. G11C 7/02
(52) U.S. Cl. ........................... 365/214; 365/63; 365/69; 365/189.04
(58) Field of Search ........................ 365/63, 69, 189.04, 365/214, 230.05

(56) References Cited

U.S. PATENT DOCUMENTS

| | | | | |
|---|---|---|---|---|
| 5,144,583 A | * | 9/1992 | Oowaki et al. | 365/206 |
| 5,287,322 A | * | 2/1994 | Rastegar | 365/69 |
| 5,586,072 A | * | 12/1996 | Longway et al. | 365/63 |
| 6,259,621 B1 | * | 7/2001 | Li et al. | 365/63 |
| 6,370,078 B1 | * | 4/2002 | Wik et al. | 365/69 |
| 6,445,638 B1 | * | 9/2002 | Hsu et al. | 365/230.05 |

* cited by examiner

Primary Examiner—Son Mai
(74) Attorney, Agent, or Firm—Carstens, Yee & Cahoon LLP

(57) ABSTRACT

A method for reducing electrical coupling within a computer multi-port memory cell array is provided. The method comprises twisting complementary wires of a first, inner bit line pair in a first memory cell column, wherein the twisting reverses the complementary wires, and wherein the physical twisting occurs in odd numbered dummy rows, twice along a column. The complementary wires of a second, outer bit line pair in the same column, wherein the physical twisting occurs in even numbered dummy rows, once along the column. The complementary wires of a third, inner bit line pair in a second memory cell column are then twisted, wherein the physical twisting occurs in even numbered dummy rows, once along the column, and the complementary wires of a fourth, outer bit line pair in the second column are twisted in odd numbered dummy rows, twice along the column. In this manner the twisting of bit line pairs is alternated within each memory cell column, and the twisting pattern is alternated between columns, thus ensuring that the net distance between any given wire and each complementary wire of another bit pair is equal.

4 Claims, 4 Drawing Sheets

TWISTED BITLINES TO REDUCE COUPLING EFFECTS (DUAL PORT MEMORIES)

BACKGROUND OF THE INVENTION

1. Technical Field

The present invention relates generally to computer memory design, and more specifically to reduction of coupling between bit lines.

2. Description of the Related Art

The central part of dynamic random access memory (DRAM) in a computer system is the memory cell array. Bits are stored in individually addressable unit memory cells, which are arranged together in an array of rows and columns. Memory cells are unambiguously determined by specifying the row and column number. The common unit memory cell is a 1-transistor-1-capacitor cell. This cell has a capacitor that holds data in the form of electric charges, and an access transistor that acts as a switch for selecting the capacitor. The gate of the transistor is connected to a word line. There are as many word lines as there are rows of memory cells. In addition to the word lines, the memory cell array also comprises bit line pairs, which are alternately connected to the sources of the access transistors. In single-port memory arrays, the number of bit line pairs is equal to the number of columns in the array. For dual-port memory arrays, there are two bit line pairs per column.

Coupling between the bit lines within a core cell, or with the bit line of an adjacent core cell, affects memory performance significantly, especially as the core cell dimensions get smaller the coupling effects increase. Coupling issues in dual-port memory cell arrays consist mainly of port-to-port coupling, cell-to-cell coupling, and coupling due to routing over memory. Thus far, a simple scheme has been used to address this issue in dual-port memories. This scheme involves twisting one of the bit line pairs. Such as solution addresses the port-to-port coupling within a cell but not necessarily all cell-to-cell coupling, or the coupling due to routing over memory.

Therefore, it would be desirable to have a method for reducing port-to-port, cell-to-cell, and over-route coupling in dual-port memory cell arrays.

SUMMARY OF THE INVENTION

The present invention provides a method for reducing electrical coupling within a computer multi-port memory cell array. The method comprises twisting complementary wires of a first, inner bit line pair in a first memory cell column, wherein the twisting reverses the complementary wires, and wherein the physical twisting occurs in odd numbered dummy rows, twice along a column. The complementary wires of a second, outer bit line pair in the same column, wherein the physical twisting occurs in even numbered dummy rows, once along the column. The complementary wires of a third, inner bit line pair in a second memory cell column are then twisted, wherein the physical twisting occurs in even numbered dummy rows, once along the column, and the complementary wires of a fourth, outer bit line pair in the second column are twisted in odd numbered dummy rows, twice along the column. In this manner the twisting of bit line pairs is alternated within each memory cell column, and the twisting pattern is alternated between columns, thus ensuring that the net distance between any given wire and each complementary wire of another bit pair is equal.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION

Figure 1:
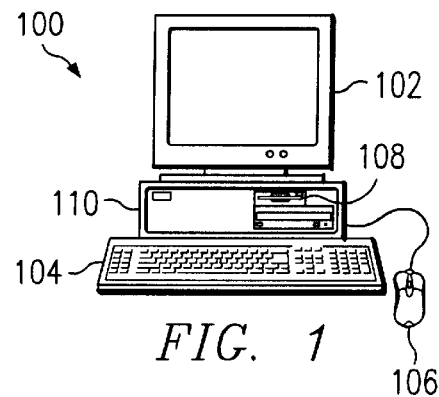
FIG. 1 depicts a pictorial representation of a data processing system in which the present invention may be implemented in accordance with a preferred embodiment of the present invention.

With reference now to the figures and in particular with reference to FIG. 1, a pictorial representation of a data processing system in which the present invention may be implemented is depicted in accordance with a preferred embodiment of the present invention. A computer 100 is depicted which includes a system unit 110, a video display terminal 102, a keyboard 104, storage devices 108, which may include floppy drives and other types of permanent and removable storage media, and mouse 106. Additional input devices may be included with personal computer 100, such as, for example, a joystick, touchpad, touch screen, trackball, microphone, and the like. Computer 100 can be implemented using any suitable computer, such as an IBM RS/6000 computer or IntelliStation computer, which are products of International Business Machines Corporation, located in Armonk, N.Y. Although the depicted representation shows a computer, other embodiments of the present invention may be implemented in other types of data processing systems, such as a network computer. Computer 100 also preferably includes a graphical user interface that may be implemented by means of systems software residing in computer readable media in operation within computer 100.

Figure 2:
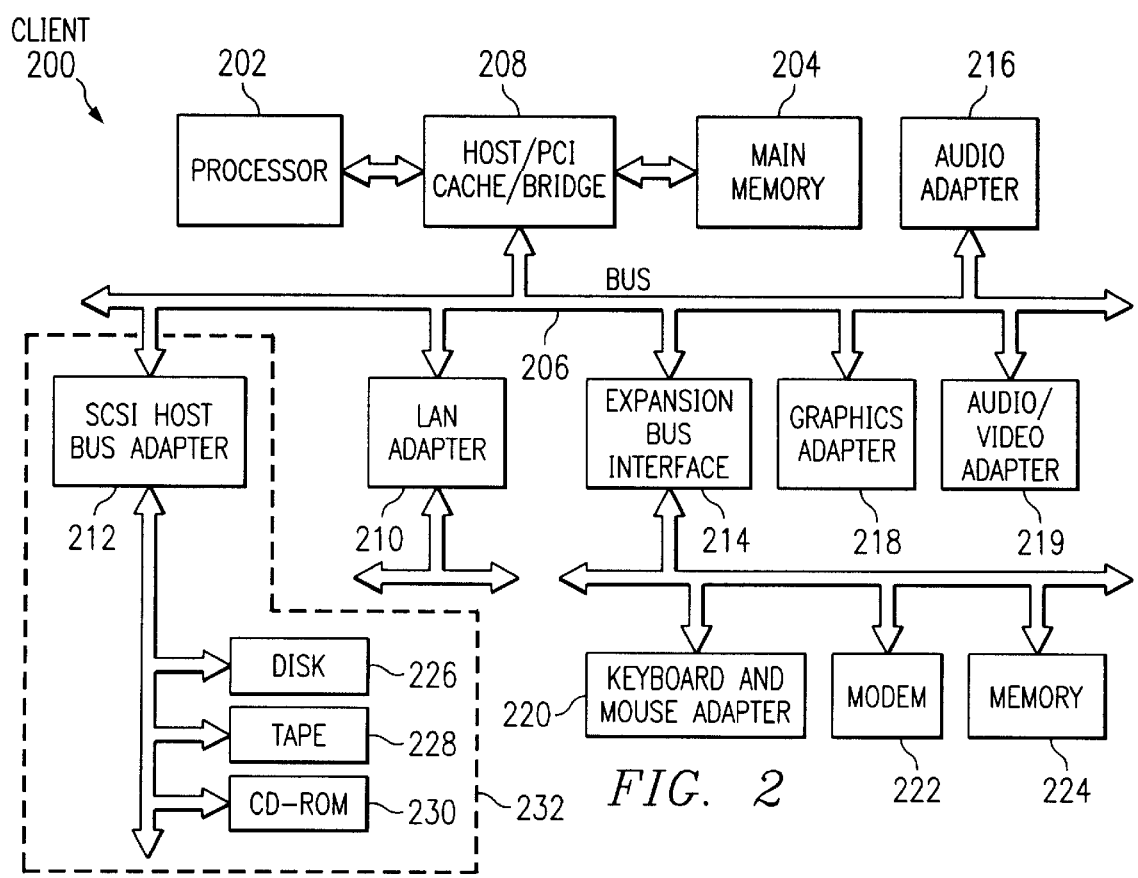
FIG. 2 depicts a block diagram of a data processing system in which the present invention may be implemented.

With reference now to FIG. 2, a block diagram of a data processing system is shown in which the present invention may be implemented. Data processing system 200 is an example of a computer, such as computer 100 in FIG. 1, in which code or instructions implementing the processes of the present invention may be located. Data processing system 200 employs a peripheral component interconnect (PCI) local bus architecture. Although the depicted example employs a PCI bus, other bus architectures such as Accelerated Graphics Port (AGP) and Industry Standard Architecture (ISA) may be used. Processor 202 and main memory 204 are connected to PCI local bus 206 through PCI bridge 208. PCI bridge 208 also may include an integrated memory controller and cache memory for processor 202. Additional connections to PCI local bus 206 may be made through direct component interconnection or through add-in boards. In the depicted example, local area network (LAN) adapter 210, small computer system interface SCSI host bus adapter 212, and expansion bus interface 214 are connected to PCI local bus 206 by direct component connection. In contrast, audio adapter 216, graphics adapter 218, and audio/video adapter 219 are connected to PCI local bus 206 by add-in boards inserted into expansion slots. Expansion bus interface 214 provides a connection for a keyboard and mouse adapter 220, modem 222, and additional memory 224. SCSI host bus adapter 212 provides a connection for hard disk drive 226, tape drive 228, and CD-ROM drive 230. Typical PCI local bus implementations will support three or four PCI expansion slots or add-in connectors.

An operating system runs on processor 202 and is used to coordinate and provide control of various components within data processing system 200 in FIG. 2. The operating system may be a commercially available operating system such as Windows 2000, which is available from Microsoft Corporation. An object oriented programming system such as Java may run in conjunction with the operating system and provides calls to the operating system from Java programs or applications executing on data processing system 200. "Java" is a trademark of Sun Microsystems, Inc. Instructions for the operating system, the object-oriented programming system, and applications or programs are located on storage devices, such as hard disk drive 226, and may be loaded into main memory 204 for execution by processor 202.

Those of ordinary skill in the art will appreciate that the hardware in FIG. 2 may vary depending on the implementation. Other internal hardware or peripheral devices, such as flash ROM (or equivalent nonvolatile memory) or optical disk drives and the like, may be used in addition to or in place of the hardware depicted in FIG. 2. Also, the processes of the present invention may be applied to a multiprocessor data processing system.

For example, data processing system 200, if optionally configured as a network computer, may not include SCSI host bus adapter 212, hard disk drive 226, tape drive 228, and CD-ROM 230, as noted by dotted line 232 in FIG. 2 denoting optional inclusion. In that case, the computer, to be properly called a client computer, must include some type of network communication interface, such as LAN adapter 210, modem 222, or the like. As another example, data processing system 200 may be a stand-alone system configured to be bootable without relying on some type of network communication interface, whether or not data processing system 200 comprises some type of network communication interface. As a further example, data processing system 200 may be a personal digital assistant (PDA), which is configured with ROM and/or flash ROM to provide non-volatile memory for storing operating system files and/or user-generated data.

The depicted example in FIG. 2 and above-described examples are not meant to imply architectural limitations. For example, data processing system 200 also may be a notebook computer or hand held computer in addition to taking the form of a PDA. Data processing system 200 also may be a kiosk or a Web appliance.

The processes of the present invention are performed by processor 202 using computer implemented instructions, which may be located in a memory such as, for example, main memory 204, memory 224, or in one or more peripheral devices 226–230.

Figure 3:
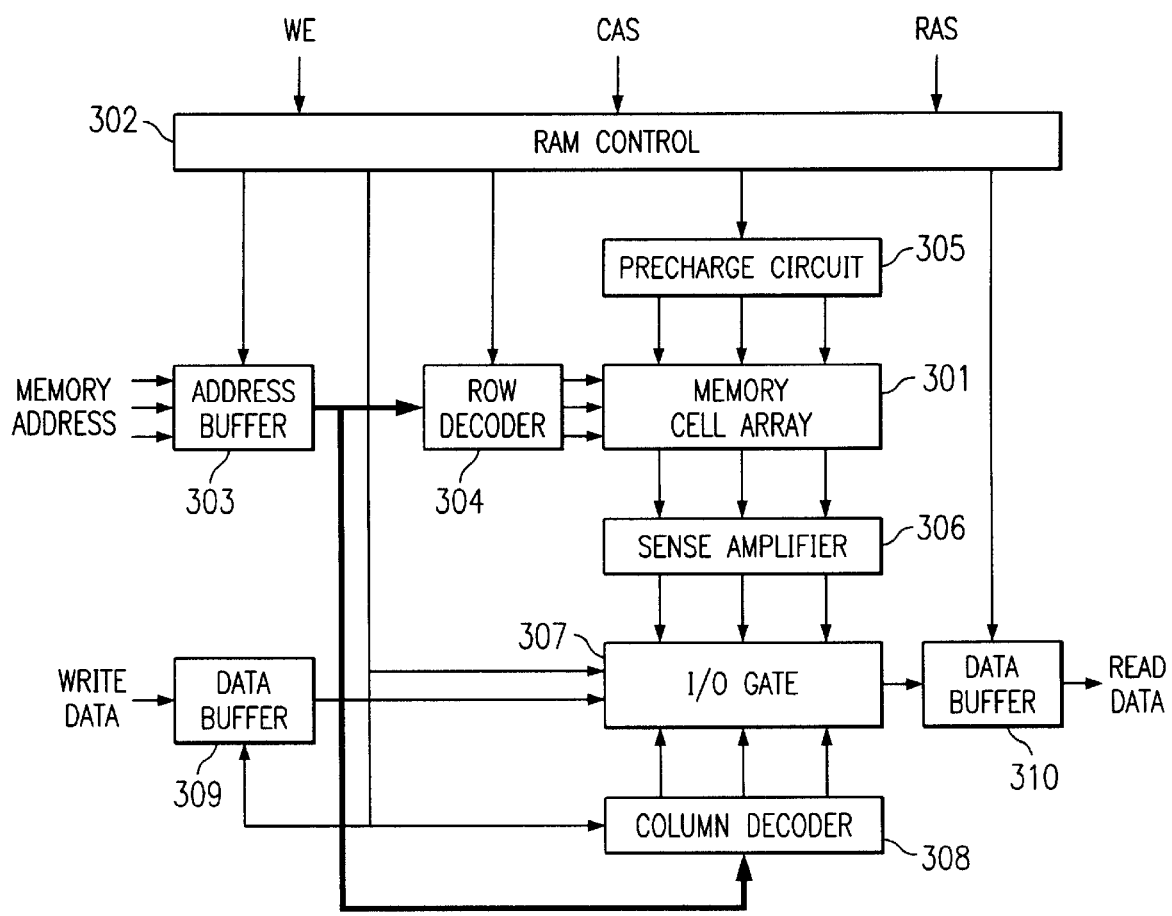
FIG. 3 depicts a block diagram of a dynamic random access memory in which the present invention may be implemented.

FIG. 3 depicts a block diagram of a random access memory in which the present invention may be implemented. The diagram illustrates the relationship between a memory system array and peripheral I/O hardware. The central part of RAM in a computer system is the memory cell array 301. Bits are stored in individually addressable unit memory cells, which are arranged together in an array of rows and columns.

In dynamic Random Access Memory (DRAM), the common unit memory cell is a 1 transistor-1-capacitor cell. This cell has a capacitor that holds data in the form of electric charges, and an access transistor that acts as a switch for selecting the capacitor. The gate of the transistor is connected to a word line. There are as many word lines as there are rows of memory cells. In addition to the word lines, the memory cell array also comprises bit line pairs, which are alternately connected to the sources of the access transistors. For single-port memory arrays, the number of bit line pairs is equal to the number of columns in the memory cell array. For dual-port memory, there are two bit line pairs per column.

In static Random Access Memory (SRAM), the common unit memory cell is composed of two access transistors, and a bistable multivibrator ("flip-flop") with two memory transistors and two load elements (resistors). Instead of storing data as charges in a capacitor, SRAM holds data in the flip-flop, which has two stable states that can be switched by a strong external signal. Like DRAM, the SRAM access transistors are connected to the word line, and the sources are connected to the bit line pair.

Because of their increased complexity, SRAM cells are more expensive than DRAM cells and have less storage capacity. SRAM is mainly used for fast and small cache memories, while DRAM is used for large and slower main memory.

Prior to memory access, the pre-charge circuit 305 charges all bit line pairs up to half of supply potential. A transistor also short circuits the bit line pairs to ensure that they each have an equal potential. Once the pre-charging and equalizing are complete, the pre-charge circuit 305 is deactivated.

The address buffer 303 accepts a memory cell address output by the RAM controller 302. For DRAM, this address is divided into two parts, a row and a column, which are read into the address buffer 303 in succession, a process known as multiplexing. Address multiplexing is controlled by Row Access Strobe (RAS) and Column Access Strobe (CAS) control signals. In general, the row address is read before the column address. When the RAM controller 302 passes the row address, it activates the RAS signal, which informs the RAM controller 302 that the supplied address is a row address. The RAM controller 302 then activates the address buffer 303 to fetch the row address and transfer it to the row decoder 304. When the RAM controller 302 passes the column address, it activates the CAS signal, which informs the RAM controller 302 that supplied address is a column address. The RAM controller 302 again activates the address buffer 303, which fetches the column address and transfers it to the column decoder 308.

Unlike DRAM, SRAM does not use multiplexing of row and column addresses. Instead, the row and column signals are provided simultaneously, and the SRAM divides the address into row and column parts internally. This is due to the faster amplifying process of SRAM signals, resulting from the greater potential difference between SRAM bit line pairs. Therefore, SRAM needs the column address much sooner in order to maintain fast access time, which multiplexing does not allow.

When data is being read, the specific memory cell in question outputs the stored data, which is amplified by a sense amplifier 306 and transferred to an I/O gate 307, which sends the data to a data buffer 310. The data buffer 310 then passes the read data via the data pins of the RAM chip. If data is to be written, the RAM controller 302 activates the Write Enable (WE) signal and supplies the write data to the data input buffer 309. The data is then sent to the I/O gate 307 and sense amplifier 306, which transfer the data to the addressed memory cell for storage.

While the discussion below uses the example of a dual-port SRAM, it should be pointed out that the present invention applies to any form of RAM.

Coupling issues in dual-port memory cell arrays consist mainly of port-to-port coupling, cell-to-cell coupling, and coupling due to routing over memory. Thus far, a simple scheme has been used to address this issue in dual-port memories.

Figure 4:
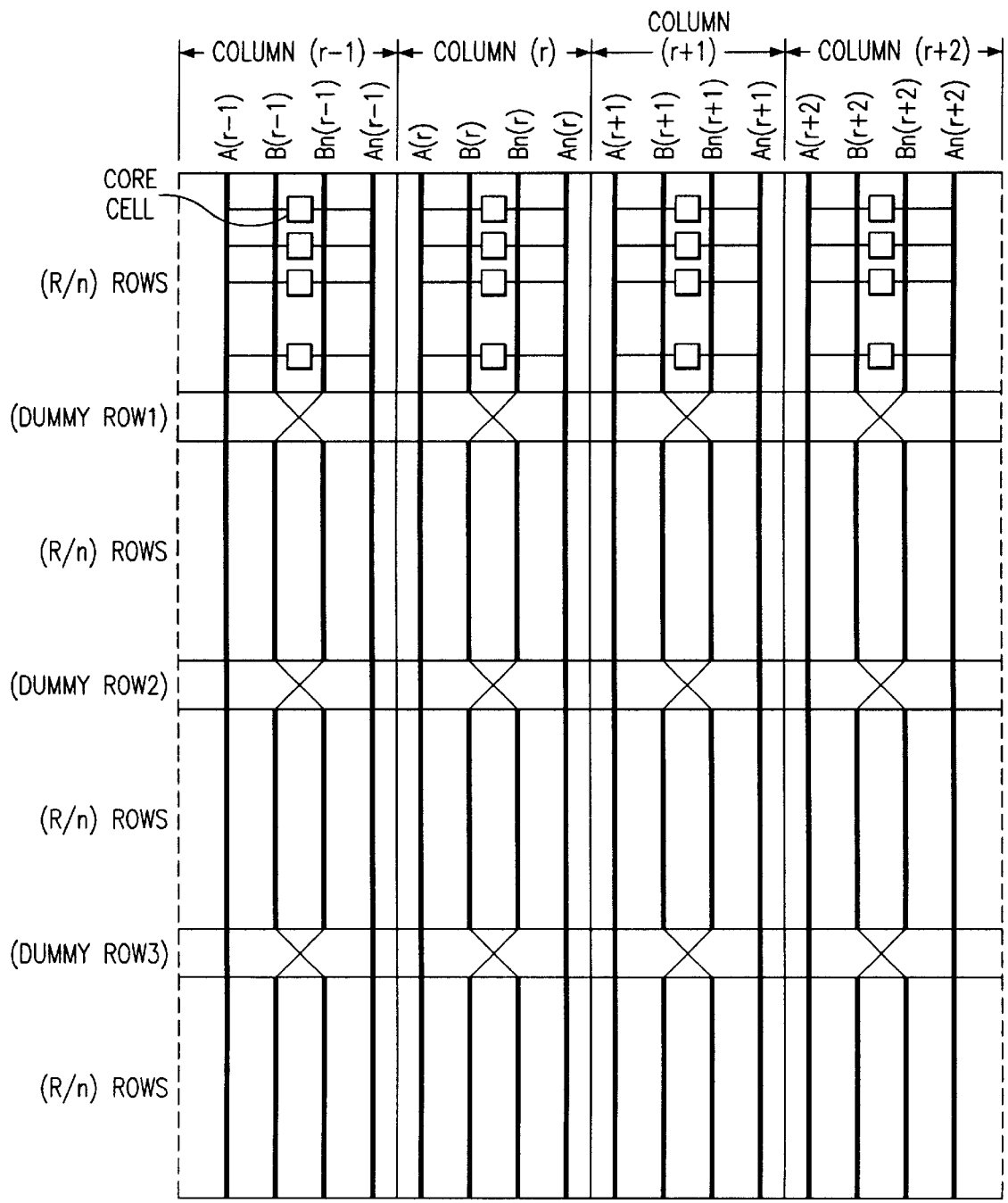
FIG. 4 depicts a schematic diagram illustrating a dual-port memory array with twisted bit lines in accordance with the prior art.

Referring now to FIG. 4 a schematic diagram illustrating a dual-port memory array with twisted bit lines is depicted in accordance with the prior art. FIG. 4 illustrates the prior scheme for reducing port-to-port coupling. Shown here is a vertical slice of a memory array comprising of four columns (r−1), (r), (r+1), and (r+2). In the present example, each column consists of n (number of rows) core cells, and runs vertically from the top to the bottom. In this figure all the columns are essentially identical. As can be seen from FIG. 4, only one bit line pair is twisted per column. The physical twisting of the bit lines occurs in the dummy rows, which are placed periodically along the array.

The twisting of the inner bit line pairs in each column completely cancels Port-to-Port coupling along a column. For example, in column (r) the inner bit line pair B(r) and Bn(r) are twisted in dummy rows 1, 2, and 3. As a result of the twisting, net coupling on B(r) from A(r) and An(r) is effectively zero because the complimentary bit lines A(r) and An(r) are at a net equal distance from B(r), and they tend to pull B(r) in opposite directions. This is analogous to equal forces acting in opposite direction. In other words, the twisting causes the complimentary bit lines A(r) and An(r) to be symmetrical with respect to B(r) over the length of the column (r).

However, the scheme in FIG. 4 does not totally cancel coupling from the adjacent cells. For example, the coupling on A(r) from An(r−1) (in column (r−1)) or from A(r+1) (in column (r+1)) is not eliminated by twisting the inner bit lines.

In addition, routing over memory has significant coupling effects when the routes run parallel to a bit line. This effect is not totally cancelled by the prior art scheme in FIG. 4. For example, a metal route running parallel to port A, in any column, tends to affect the signal development/slew rate, and hence the differential signal between the complimentary lines (e.g., lines A(r) and An(r)). To account for these shortcomings a new twisted bit line scheme is proposed.

Figure 5:
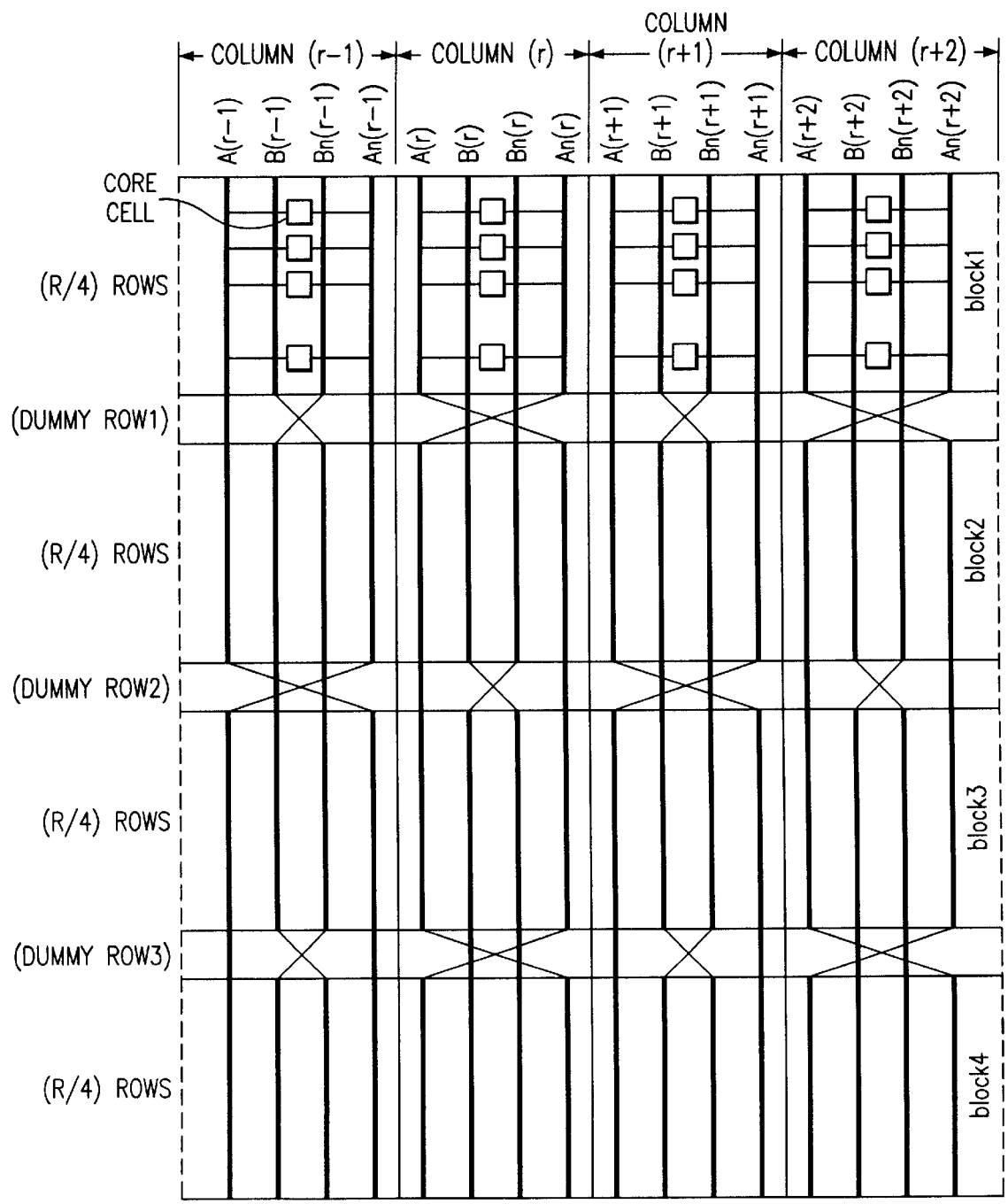
FIG. 5 depicts a schematic diagram illustrating a dual-port memory array with twisted bit lines in accordance with the present invention.

Referring to FIG. 5, a schematic diagram illustrating a dual-port memory array with twisted bit lines is depicted in accordance with the present invention. Using the approach of the present invention, the bit line pairs of both ports are twisted in a slightly complicated way in each column. The columns are placed such that cell-to-cell coupling, and memory over-route coupling are cancelled in addition to port-to-port coupling.

FIG. 5 depicts a vertical slice of memory array consisting of four columns (r−1), (r), (r+1), and (r+2), similar to FIG. 4. Columns (r−1) and (r) define the bitline twisting scheme, and are repeatedly placed through out the memory array. Similar to FIG. 4, the physical twisting of the bit lines occurs in the dummy rows 1, 2, and 3, which divide the entire array into four slices. In column (r−1), the inner bit line pair B(r−1) and Bn(r−1) are twisted in the odd number dummy rows 1 and 3, while the outer bit line pair A(r−1) and An(r−1) are twisted in the even dummy row 2. The next column (r) uses the opposite pattern of twisting, with the inner bit line pair B(r) and Bn(r) twisted in the even dummy row 2 and the outer pair twisted in the odd dummy rows 1 and 3. These respective patterns are alternated across the columns.

The idea behind this alternate twisting scheme is to position any bit line, e.g., A(r), such that its net distance from any other bitline, e.g., A(r−1) and An(r−1), is the same. Since the complimentary bit lines in a pair tend to be in opposite states during an active cycle, the above theory effectively cancels the coupling. This is true for any bit line relative to any other pair of complimentary bit lines. For example, consider the interaction between the bit line A(r), and the A(r+1)/An(r+1) pair. Assuming the bit line are uniformly separated by a distance 'a':

Distance, D1, between A(r) and A(r+1) is:
D1=4a [block 1]+a [block 2]+4a [block 3]+7a [block4]=16a Distance, D2, between A(r) and An(r+1) is:
D2=7a [block1]+4a [block2]+a [block3]+4a [block4]= 16a Since A(r+1) and An(r+1) tend to move in opposite directions in an active cycle, and since they are at symmetrically equal distance from A(r), the net coupling is zero. It should be noted that the assumption of uniform distance 'a' between the bit lines is for the sake of simplicity. The above example can be verified with an actual set of variables defining the various distances (not necessarily uniform) among the lines.

The above example illustrates the cancellation of cell-to-cell coupling. By replacing the complimentary bit line pair A(r+1)/An(r+1) with B(r)/Bn(r), it can be verified that this scheme cancels the port-to-port coupling as well:

Distance, D3, between A(r) and B(r) is:
D3=a [block 1]+2a [block 2]+a [block 3]+2a [block 4]=6a Distance, D4, between A(r) and Bn(r) is:
D4=2a [block 1]+a [block 2]+2a [block 3]+a [block 4]=6a It can also be seen from FIG. 5 that a routing metal running parallel to the bit line affects the complimentary lines, e.g., A(r)/An(r), in an equal fashion. That is, the lines are pulled in the same direction, and hence there is no effect on the differential signal between them.

Data-inversion occurs in certain rows of the array because of the twisted bit lines. To account for this data-inversion, additional logic is used in the peripheral hardware, e.g., sense amplifier 306. The same data-inversion logic is also used in the prior art scheme in FIG. 4, and can be used with the present invention without any overhead, and can be flexibly programmed.

Though the present invention has been described here specifically within the context of a dual-port memory array it can be extended to other multi-port memory designs.

The description of the preferred embodiment of the present invention has been presented for purposes of illustration and description, but is not limited to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

What is claimed is:

1. A method for reducing electrical coupling within a computer multi-port memory cell array, the method comprising:

twisting complementary wires of a first, inner bit line pair in a first memory cell column, wherein the twisting reverses the complementary wires, and wherein the physical twisting occurs in odd numbered dummy rows;

twisting complementary wires of a second, outer bit line pair in the first memory cell column, wherein the twisting reverses the complementary wires, and wherein the physical twisting occurs in even numbered dummy rows;

twisting complementary wires of a third, inner bit line pair in a second memory cell column, wherein the twisting reverses the complementary wires, and wherein the physical twisting occurs in even numbered dummy rows;

twisting complementary wires of a fourth, outer bit line pair in the second memory cell column, wherein the twisting reverses the complementary wires, and wherein the physical twisting occurs in odd numbered dummy rows; and wherein the twisting of the wires ensures that the net distance between any given wire and each complementary wire of another bit pair is equal.

2. The method according to claim 1, wherein the memory cell array comprises static access memory.

3. The method according to claim 1, wherein the memory cell array comprises dynamic access memory.

4. The method according to claim 1, wherein the memory cell array comprises a dual-port memory array.

* * * * *